US008039181B2

(12) United States Patent
Seltmann et al.

(10) Patent No.: US 8,039,181 B2
(45) Date of Patent: Oct. 18, 2011

(54) METHOD AND SYSTEM FOR REDUCING OVERLAY ERRORS IN SEMICONDUCTOR VOLUME PRODUCTION USING A MIXED TOOL SCENARIO

(75) Inventors: Rolf Seltmann, Dresden (DE); Jens Busch, Radebeul (DE); Uwe Schulze, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 295 days.

(21) Appl. No.: 12/476,578

(22) Filed: Jun. 2, 2009

(65) Prior Publication Data

US 2010/0028790 A1 Feb. 4, 2010

(30) Foreign Application Priority Data

Jul. 31, 2008 (DE) .......................... 10 2008 035 814

(51) Int. Cl.
*G03C 5/00* (2006.01)
*G03F 9/00* (2006.01)
(52) U.S. Cl. ............ 430/22; 430/30; 430/312; 430/313; 430/394
(58) Field of Classification Search .................. 430/22, 430/30, 312, 313, 394
See application file for complete search history.

(56) References Cited

U.S. PATENT DOCUMENTS

| 6,841,321 | B2 * | 1/2005 | Matsumoto et al. | 430/30 |
| 7,126,669 | B2 * | 10/2006 | Edart | 355/55 |
| 7,651,825 | B2 * | 1/2010 | Van Bilsen | 430/22 |
| 7,842,442 | B2 * | 11/2010 | Seltmann et al. | 430/22 |
| 2002/0111038 | A1 | 8/2002 | Matsumoto et al. | 438/763 |
| 2006/0139596 | A1 | 6/2006 | Edart | 355/55 |
| 2006/0210893 | A1 | 9/2006 | Van Bilsen | 430/30 |
| 2008/0057518 | A1 | 3/2008 | Tanguay et al. | 435/7.21 |

OTHER PUBLICATIONS

Translation of Official Communication from German Patent Office for German Patent Application No. 10 2008 035 814.2-51 dated Apr. 22, 2009.

* cited by examiner

*Primary Examiner* — Christopher Young
(74) *Attorney, Agent, or Firm* — Williams, Morgan & Amerson

(57) ABSTRACT

By taking into consideration the combination of the substrate holders in various lithography tools used during the imaging to two subsequent device layers, enhanced alignment accuracy may be accomplished. Furthermore, restrictive tool dedications for critical lithography processes may be significantly relaxed by providing specific overlay correction data for each possible process flow, wherein, in some illustrative embodiments, a restriction of the number of possible process flows may be accomplished by implementing a rule for selecting a predefined substrate holder when starting the processing of an associated group of substrates.

19 Claims, 5 Drawing Sheets

METHOD AND SYSTEM FOR REDUCING OVERLAY ERRORS IN SEMICONDUCTOR VOLUME PRODUCTION USING A MIXED TOOL SCENARIO

BACKGROUND OF THE INVENTION

1. Field of the Invention

The present disclosure relates to the field of fabricating microstructures, such as integrated circuits, and, more particularly, to a technique for controlling alignment accuracy and pattern placement precision during lithography processes in forming and patterning stacked material layers.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate or other suitable carrier materials. These tiny regions of precisely controlled size are generated by patterning the material layer by performing lithography, etch, implantation, deposition, oxidation processes and the like, wherein typically, at least in a certain stage of the patterning process, a mask layer may be formed over the material layer to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance is the accuracy with which an image can be positioned on the surface of the substrate. Typically, microstructures, such as integrated circuits, are fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure dose and time and development conditions. Furthermore, non-uniformities of the etch processes can also lead to variations of the etched features. In addition, there exists an uncertainty in overlaying the image of the pattern of the current material layer to the etched or otherwise defined pattern of the previously formed material layer while photolithographically transferring the image of the photo mask onto the substrate. Several factors contribute to an imperfect ability of the imaging system to overlay two layers, such as imperfections within a set of masks, temperature differences at the different times of exposure, a limited registration capability of the alignment tool and, as a major contribution to alignment errors, imperfections of the exposure tool itself, such as lens distortions, and distortions caused by the alignment hardware, such as the substrate holder, and the like. The situation becomes even worse when different exposure tools are used for defining subsequent device layers, since then the inherent errors in the exposure tool and related components may vary between the different tools.

Although the same exposure tool might be used for imaging critical device layers, in practice, such restrictions may not allow an efficient overall process flow in a complex manufacturing environment, which typically comprises a plurality of lithography tools for the same device layer. As a result, the dominant criteria for determining the minimum feature size that may finally be obtained are the resolution for creating features in individual substrate layers and the total overlay error to which the above-explained factors, in particular the lithographic process, contribute.

Therefore, it is essential to continuously monitor the resolution, i.e., the capability of reliably and reproducibly creating the minimum feature size, also referred to as critical dimension (CD), within a specific material layer, and to continuously determine the overlay accuracy of patterns of material layers that have been successively formed and that have to be aligned to each other. For example, when forming a wiring structure for an integrated circuit, respective metal lines and vias, which connect two stacked metal regions, may have to be aligned to each other with strict process margins, since a significant misalignment may cause a short between actually non-connected lines, thereby possibly creating a fatal device defect.

Thus, modern advanced process control (APC) strategies strive to reduce respective errors on the basis of the measurement results obtained from previously measured substrates, in order to feed back the mismatch indicated by the measurement data for reducing the alignment error in the next substrate to be processed. APC controllers may have a predictive behavior, which is typically referred to as model predictive control (MPC), which may be convenient when the amount of available measurement data is restricted due to process requirements.

For generating appropriate manipulated values, the measured "overlay" may be separated into individual alignment parameters, such as magnification, translation, substrate rotation, reticle rotation, orthogonality and the like. Consequently, a corresponding exposure tool recipe for aligning the image of a reticle with respect to a specified position of the substrate may contain respective manipulated variables that correspond to the overlay parameters specified above. The manipulated variables may represent so-called controller inputs, that is, any process parameters of the lithography tool which may be adjusted by the controller so as to obtain specified values for the above-specified overlay parameters or control variables, such as magnification, x-translation, orthogonality and the like.

For instance, in controlling the accurate pattern placement of two corresponding device layers, measurement results may be gathered from a stream of a specific number of substrate lots to calculate the alignment parameters, for instance ten alignment parameters of a linear alignment model, which may then be fed back to the lithography tool to expose the next substrate lot. In this way, drifts of the lithography tool or changes in the technology may be corrected. As previously discussed, high volume production lines for semiconductor devices may have to fulfill critical overlay specifications while at the same time reduce overall cycle time per mask layer. For this reason, advanced lithography tools, such as step and scanning tools, may have two substrate holders or chucks to provide alternating processing, i.e., while exposing one substrate, a further substrate is aligned and positioned in the other substrate holder. Since the characteristics of the substrate holders may also have a significant effect on the finally obtained alignment precision, and thus on the exposure of the substrates, respective overlay correction data, i.e., the corresponding linear alignment parameters, may be established separately for each substrate holder in order to enable different corrections for each of the substrate holders. Although significant improvements with respect to overall process accuracy may be achieved, in particular in sophisticated production lines, in which typically a plurality of lithography tools may be used, the degree of alignment accuracy may not be compatible with the quality specifications. Hence, very restrictive constraints may be imposed on the lithography processes, for instance by dedicating tools so that two subsequent critical mask layers may be imaged by the same lithography tool. Consequently, a reduced flexibility in substrate scheduling may occur, thereby contributing to a significant increase of overall cycle time, in particular in high volume production process lines.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and systems in which alignment accuracy of critical lithography processes may be enhanced while at the same time providing increased flexibility in scheduling the substrate flow in high volume production lines, in which a plurality of lithography tools may be used for the critical lithography processes. For this purpose, the principles disclosed herein may take into consideration the status of the lithography tool and the corresponding substrate holder used during the processing of a substrate for imaging a first critical process layer when selecting appropriate alignment correction data for imaging a subsequent mask layer on the same substrate. That is, upon selecting appropriate alignment correction data, the history of the substrate to be processed may be taken into consideration, which may be accomplished by providing a plurality of overlay correction data so as to cover any of the possible process flows that a substrate may take when forming the two subsequent critical device layers. Thus, by tracking the history of the substrate, an appropriate process flow specific set of correction data may be used, which may thus include information on the mutual interaction of the various items of the process flow, such as the different substrate holders used during the subsequent critical lithography processes. Moreover, in some illustrative aspects disclosed herein, the overlay correction data sets may be updated upon detecting a significant change or drift in one of the process flows so that, for instance, a time variation of substrate holder specific influences may be taken into consideration when selecting an appropriate overlay correction data set. That is, based on the updated versions and the previous versions, an appropriate set of overlay correction data may be selected, which may represent the status of the lithography tool and the substrate holder as used at the time the first critical device layer has been imaged onto the substrate and which also represent the status of the lithography tool to be used for processing the substrate so as to form the subsequent critical device layer. Moreover, in other illustrative aspects disclosed herein, non-linear corrections may be obtained on the basis of respective measurements, which may refer to the various process flows including the different combinations of substrate holders used in the various lithography tools, thereby even further enhancing alignment accuracy. In addition, the definition appropriate overlay correction data sets may be extended to other non-lithography tools so as to also take into consideration the effects of these tools on the overall placement accuracy.

One illustrative method disclosed herein comprises generating a plurality of sets of overlay correction data for a pair of a first lithography tool and a second lithography tool, wherein the first lithography tool is used for imaging a first device layer on a substrate and the second lithography tool is used for imaging a second device layer on the substrate. Moreover, the second device layer is spatially related to the first device layer and each of the plurality of sets of overlay correction data corresponds to a different status of the first and/or the second lithography tool. Furthermore, the method comprises obtaining process information associated with a product substrate to be processed in the second lithography tool, wherein the product substrate has formed thereon the first device layer. The process information indicates a status of the first lithography tool when processing the product substrate. Additionally, the method comprises selecting one of the plurality of sets of overlay correction data that represents the status of the first lithography tool when processing the product substrate and representing a current status of the second lithography tool. Finally, the method comprises processing the product substrate in the second lithography tool on the basis of the selected one of the plurality of sets of overlay correction data.

A further illustrative method disclosed herein comprises associating each of a plurality of process flows with at least one of a plurality of sets of overlay correction data, wherein each process flow is defined by processing a substrate first in a first lithography tool and then in a second lithography tool. Furthermore, the process flows differ from each other at least in a combination of substrate holders used for processing the substrate in the first and second lithography tools. The method further comprises processing at least one further substrate according to one of the plurality of process flows by using an associated one of the plurality of sets of overlay correction data when processing the at least one further substrate in the second lithography tool.

One illustrative alignment control system disclosed herein comprises a database including at least one set of process flow specific overlay correction data for each of a plurality of process flows. Each process flow is defined by processing a substrate first in a first lithography tool and then in a second lithography tool, wherein the process flows differ from each other at least in a combination of substrate holders used for processing the substrate in the first and second lithography tools. The alignment control system further comprises a controller operatively connected to the database and configured to selectively retrieve a set of overlay correction data corresponding to a process flow of a substrate to be processed in the second lithography tool. Furthermore, the controller is further configured to align the substrate in the second lithography tool on the basis of the retrieved set of overlay correction data.

BRIEF DESCRIPTION OF THE DRAWINGS

The disclosure may be understood by reference to the following description taken in conjunction with the accompanying drawings, in which like reference numerals identify like elements, and in which.

Figure 1A:
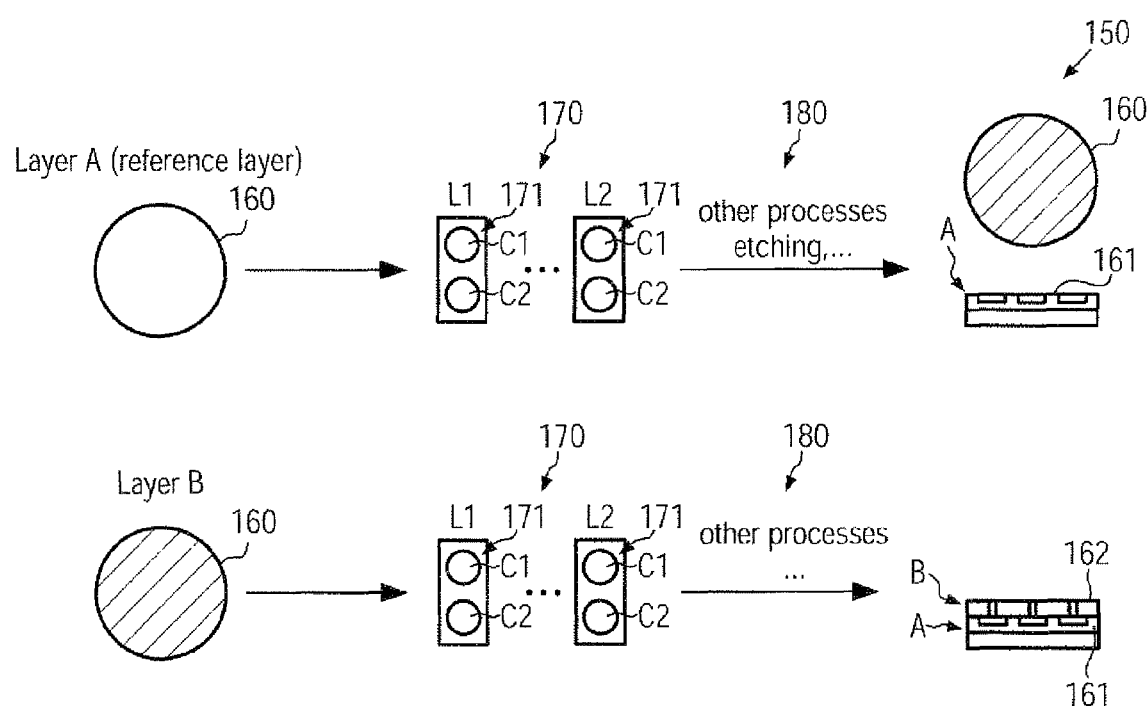
FIG. 1a schematically illustrates a process flow for forming a first device layer, which may also be referred to as a reference layer, on a plurality of substrates by means of the plurality of lithography tools, and forming a subsequent layer on the substrates by using the plurality of lithography tools, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and systems in which alignment accuracy may be enhanced, while at the same time less restrictive constraints with respect to tool dedication for advanced lithography tools may be achieved. To this end, the measurement data used during the APC control strategies may be referenced to a plurality of different process flows which may be taken by a product when passing through two subsequent critical lithography processes. The process flows defined by the two subsequent critical lithography processes may have a "granularity" that may at least distinguish between the various substrate holders or chucks in the lithography tools. That is, substrates that are processed in the same lithography tool in both lithography steps, however by using different substrate holders, may be considered as being processed according to different process flows. Consequently, the substrate holders' influence on the overall alignment accuracy may be represented in the corresponding measurement data and thus correction data obtained, which may therefore provide enhanced accuracy when applying corresponding correction data to substrates which are to be processed on the basis of the respective process flow. Consequently, by this type of "categorization" of the process flows, enhanced flexibility for scheduling the overall product flow in critical lithography steps may be achieved, while also enhancing the overall accuracy alignment since only measurement data of the same process flow may be used for establishing the associated set of overlay correction data. In some illustrative embodiments, a significant reduction of the process flows may be accomplished by implementing specific rules for operating the lithography tools, for instance by first starting the processing of an associated group of substrates with the same predefined substrate holder. Moreover, by performing an appropriate sort process prior to actually processing the associated group of substrates in the second lithography process so as to reestablish a certain order, such as an "odd-even" order when lithography tools with two substrate holders are considered, in combination with the above-indicated strategy, the number of possible process flows may be reduced. In this manner, the amount of measurement data and overlay correction data sets may be reduced, substantially without affecting the overall cycle time, since only a short time may have to be "sacrificed" when requesting that each lithography tool may start with a dedicated substrate holder. Moreover, further enhancement of the alignment accuracy may be accomplished by taking into consideration non-linear corrections in addition to the linear alignment parameter, which may be accomplished on the basis of appropriate measurement procedures and calculation of the residual part of the linear models used for obtaining the linear alignment parameters. Moreover, the variation in time of the status of the lithography tools and thus of the various process flows may be incorporated, in some illustrative embodiments, so as to also monitor the time variation of the influences of the various substrate holders on the overall alignment accuracy. To this end, corresponding versions of the overlay correction data sets for each of the process flows may be maintained so that, for each substrate, alignment may be controlled on the basis of correction data corresponding to the status of the process flow at the time the substrate has been processed in the first lithography process and the status of the lithography tool to be used for the subsequent lithography process.

FIG. 1a schematically illustrates a manufacturing environment 150 which may represent a complex manufacturing environment for performing at least a plurality of manufacturing processes to form a first device layer 161, which may also be referred to as layer A or as reference layer, on a substrate 160, which may represent any appropriate carrier material for forming thereon semiconductor devices, microstructural devices and the like. For this purpose, the manufacturing environment 150 may comprise a plurality of process tools 170, 180 configured to perform the corresponding manufacturing processes. For example, the plurality of process tools 170 may represent lithography tools, wherein individual lithography tools may also be referred to as lithography tools L1, L2, which may have any appropriate configuration to perform critical lithography processes. It should be appreciated that although only two lithography tools L1, L2 are illustrated in FIG. 1a, more than two lithography tools may be used in highly complex manufacturing environments. Each of the lithography tools 170 may thus comprise an appropriate optical system (not shown) to expose portions of the substrate 160 on the basis of a corresponding lithography mask corresponding to the device layer under consideration, i.e., the layer 161 or layer A. For instance, the layer 161 may represent a layer for forming circuit features, such as metal regions, gate electrodes and the like, upon which other circuit features, such as vias, contact elements and the like, may have to be formed in a later manufacturing stage on the basis of a subsequent lithography process, wherein a spatial relationship between the layer 161 and the subsequent layer may have a significant influence on the overall device performance. The lithography tools 170 may comprise appropriate mechanical and electronic components to perform the various process steps, wherein, for instance, one important step may have an automatic alignment procedure. In a corresponding alignment procedure, hardware components may be controlled on the basis of appropriately selected target values, which may be provided by an APC control system (not shown) which may be operated so as to provide a minimum discrepancy between the actual process outcome of the alignment procedure and the input target values of the various alignment parameters, such as translation, magnification, rotation and the like, as previously explained. As indicated above, in advanced lithography tools, typically two hardware components may be provided for receiving and holding in place a substrate during the alignment and exposure procedure. For example, the lithography tools 170 may comprise substrate holders or chucks 171, which are also indicated as C1 and C2.

Moreover, the manufacturing environment 150 may comprise process tools 180, which may represent non-lithography tools, such as etch tools, chemical mechanical polishing (CMP) tools, anneal tools and the like, as may be required for actually forming the layer 161 on the basis of a mask obtained by a lithography process performed by the tools 170.

When processing the substrate 160 in the environment 150 to form the layer 161, the substrate 160 may be supplied to one of the lithography tools 170, depending on the overall scheduling regime in the environment 150. It should be appreciated that, typically, substrates may be handled in the environment 150 in associated groups, wherein each member of the group may receive the same sequence of process steps performed on the basis of the same process recipes. Thus, the substrate 160 and any associated substrates may be supplied to one of the lithography tools 170 wherein, as previously discussed, a respective substrate may be positioned at one of the substrate holders 171, depending on the overall operating strategy for the lithography tools 170. Contrary to conventional strategies, in some illustrative embodiments disclosed herein, a plurality of possible process flows may be defined, which may represent any possible combinations of lithography tools and substrate holders that may be used by the substrate 160 when forming the layer 161 and a subsequent layer. Hence, during the processing of the substrate 160, it may be received by the lithography tool L1 and in the tool L1 by one of the substrate holders C1, C2. Moreover, the substrate 160 may alternatively be received by the lithography tool L2 and thereby one of the substrate holders C1 and C2. Consequently, four different possibilities of processing the substrate 160 may exist for an arrangement in which two lithography tools L1 and L2 may be used, each having the two substrate holders C1 and C2. It should be appreciated that, during actually processing the substrate 160 in one of the tools L1, L2 by using one of the corresponding substrate holders 171, a different process outcome may be obtained due to specific differences, for instance with respect to the substrate holders 171. After passing through the remaining process tools 180, the layer 161 may have "encoded" therein the specific pattern of the device layer and corresponding specifics of the lithography tool and the substrate holder used.

Similarly, a further section of the overall process flow may be provided within the environment 150 to form a subsequent layer 162, which may also be referred to as layer B, above the substrate 160 having formed thereon the reference layer A or layer 161. Similarly, the substrate 160 may be staged through a corresponding lithography process to be performed by one of the lithography tools 170. Thereafter, further processes may be performed by one or more of the tools 180, thereby resulting in the layer 162, which may have a specified spatial relationship to the layer 161, wherein the overlay accuracy may be determined by the specific process flow used for the substrate 160 during processing in one of the lithography tools 170 for forming the layer 161 and the layer 162.

Figure 1B:
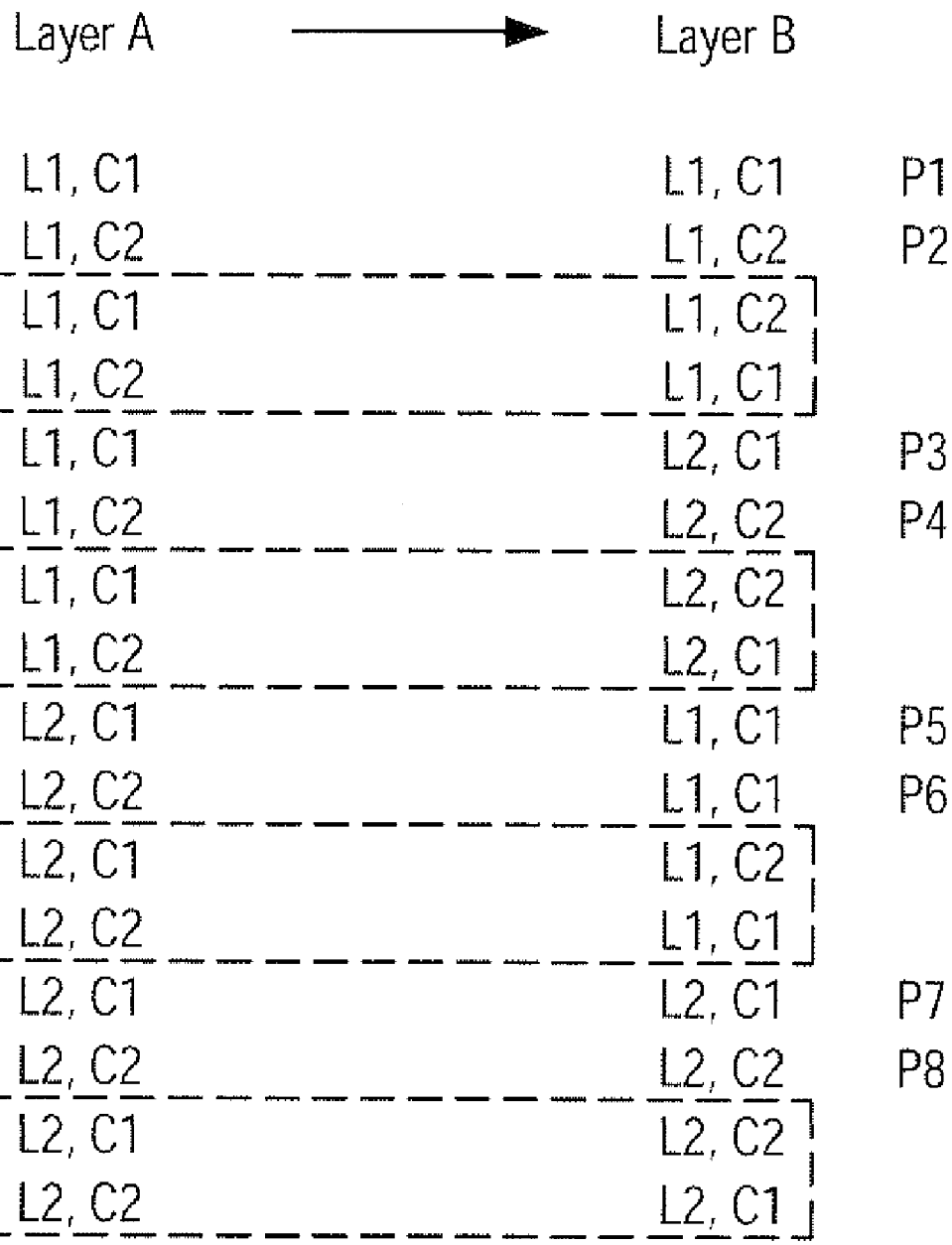
FIG. 1b schematically illustrates a table of process flows of the manufacturing environment of FIG. 1a, according to further illustrative embodiments.

FIG. 1b schematically illustrates a table of possible process flows for forming the layers 162 and 161 according to an arrangement as shown in FIG. 1a. That is, it may be assumed that two lithography tools such as the tools L1 and L2 may be used, wherein each has two substrate holders C1 and C2. It should be appreciated however that the principles disclosed herein may readily be applied to any number of lithography tools.

As shown in FIG. 1b, the process flows are indicated by the name of the lithography tool used and the corresponding substrate holder for each of the layers A and B. Thus, for instance, a process flow P1 may be defined by a combination of L1, C1 for the layer A and a combination of L1, C1 for the layer B. That is, layer A, i.e., layer 161, may be formed by using lithography tool L1 and using the substrate holder C1 therein when imaging the corresponding lithography mask onto the substrate 160. Moreover, layer B, i.e., the layer 162, may be formed on the basis of a lithography process also performed in the lithography tool L1 and also using the substrate holder C1. Similarly, a process flow P2 may be defined by a combination in which the layer L1 may be formed by using the lithography L1 and the substrate holder C2 and also forming the layer B using the lithography tool L1 and the substrate holder C2. Consequently, for the arrangement as shown in FIG. 1a, in total 16 different process flows may be obtained, thereby covering any combinations of lithography tools and substrate holders the substrate 160 may take through the manufacturing process for forming the layers 161 and 162. It should be appreciated that each of the various process flows may result in a process flow specific process result with respect to overall alignment accuracy. Consequently, by using the process flow specific measurement data and thus overlay correction data sets, for instance in the form of the correspondingly calculated alignment parameters, a significant enhancement of the overall alignment accuracy may be accomplished compared to conventional strategies in which only two different correction data sets may be used in the lithography tools 170 during forming the layer 162 on the basis of the layer 161, thereby "ignoring" the fact that the layer 161 is also formed on the basis of different lithography tools and different substrate holders. Even if a very restrictive tool dedication may be used in conventional strategies, that is, the layers 161 and 162 may be formed by using the same lithography tools, the influence of the different substrate holders C1, C2 of the corresponding dedicated lithography tool during the formation of the layer 161 is ignored. Consequently, based on the various process flows defined in accordance with the principles disclosed herein, for instance by using the process flows P1-P8 or all of the process flows as shown in FIG. 1b, enhanced control efficiency may be obtained while also providing the possibility of using any of the lithography tools without a specific tool dedication.

In one illustrative embodiment, the number of possible process flows may be reduced so as to also reduce the amount of measurement data required and corresponding sets of overlay correction data. In one illustrative embodiment, the number of possible process flows may be reduced to one half by implementing an appropriate tool rule operating the lithography tools and implementing an additional process step.

Figure 1C:
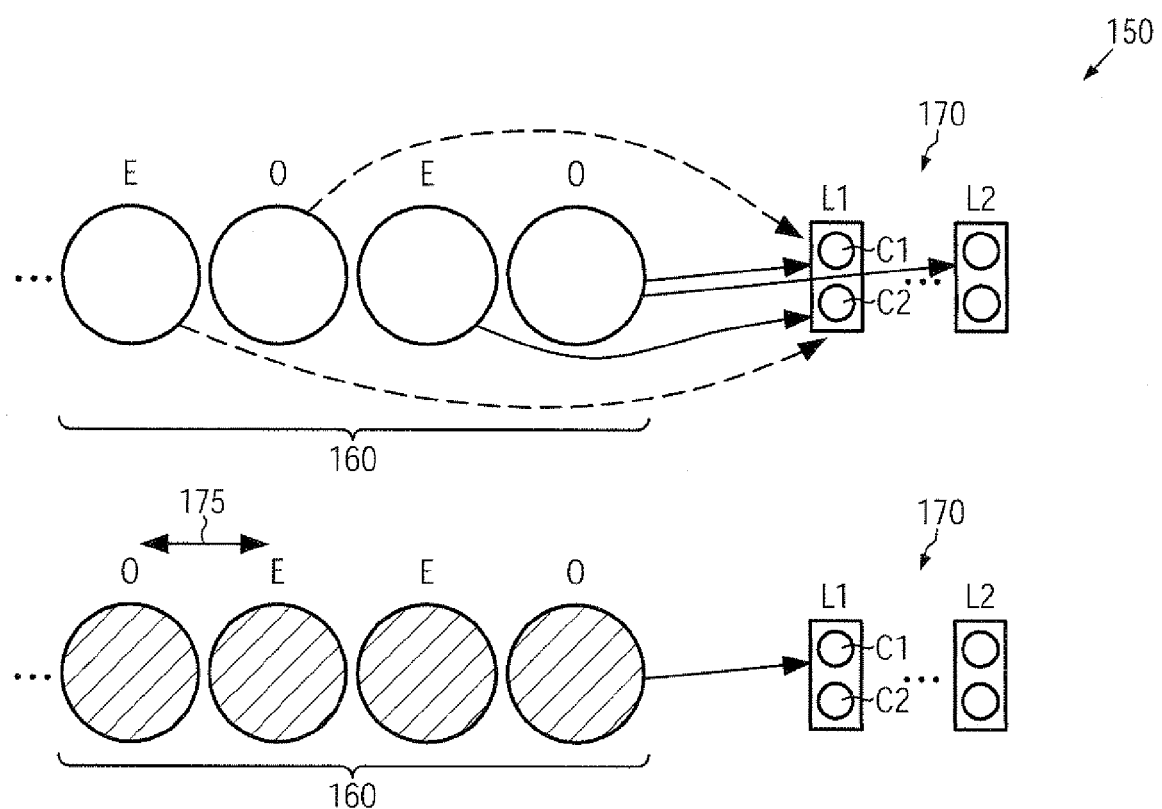
FIG. 1c schematically illustrates a process regime for reducing the number of possible process flows, according to illustrative embodiments.

FIG. 1c schematically illustrates the environment 150 in which the lithography tools 170 may be operated so as to receive the substrates 160 such that a respective one of the lithography tools 170 may start operation of an associated group of substrates 160 by using a predefined substrate holder. For example, as illustrated, the group of substrates 160 may be processed in the lithography tool L1 such that the first substrate, indicated as an "odd" (O) substrate, may be processed in the substrate holder C1. Thereafter the substrates 160 may be supplied in an alternating fashion to the lithography tool L1. Similarly, if it is decided that the group of substrate 160 may be processed in the lithography tool L2, also a predefined substrate holder, such as the substrate holder C1, may be used as a starting entity and thereafter an alternating supply may take place. Similarly, any other group of associated substrates may be processed in this manner so that, for instance, if for the lithography tool L1 the substrate holder C1 is selected as the starting entity, each first substrate of any group may be processed by the substrate holder C1 in the tool L1. Similarly, the processing of any substrates in the lithography tool L2 may also start with the same predefined substrate holder. In this manner, an "odd-even" sequence may be defined during the processing of the substrates 160 and any other group of substrates which may be reestablished in a later manufacturing stage when the substrates 160 are again to be processed in the lithography tools 170 in order to form the subsequent device layer 162 (see FIG. 1a). A corresponding situation is shown in FIG. 1c in the lower portion, wherein an additional sort process 175 may be incorporated into the overall manufacturing flow prior to supplying the substrates 160 to one of the tools L1, L2. For example, as shown during the processing by the process tools 180 (see FIG. 1a), the order of the substrates 160 may have been changed, which may be detected on the basis of an appropriate process information which may be available during the sort process 175 so as to appropriately rearrange the substrates 160 in such a manner that at least the sequence "odd-even" is reestablished without actually requiring the same ordering of the substrates 160 as previously used during the preceding lithography process.

For example, a rule may be implemented such that each first substrate of an associated group, such as the substrates 160, may be processed in one dedicated substrate holder, such as C1 of the lithography tools L1 and L2. As a result, in combination with the additional sort step 175, half of the process flows as shown in FIG. 1b may be excluded. As illustrated in FIG. 1b, corresponding process flows of the boxes shown in dashed lines may be excluded. For instance, a process flow defined by (L1, C1, L1, C2) may be excluded due to the above-specified policy in operating the tools L1 and L2 in combination with the additional sort step 175. Consequently, a significant reduction of possible process flows may be accomplished while not unduly affecting the overall cycle time of the lithography tools 170. That is, upon receiving a further associated group at one of the lithography tools L1 and L2, the start of processing the newly arriving group may at most have to be postponed one cycle time of the corresponding lithography tool when the dedicated "starting" substrate holder may still be occupied by the last substrate of the preceding group.

Figure 1D:
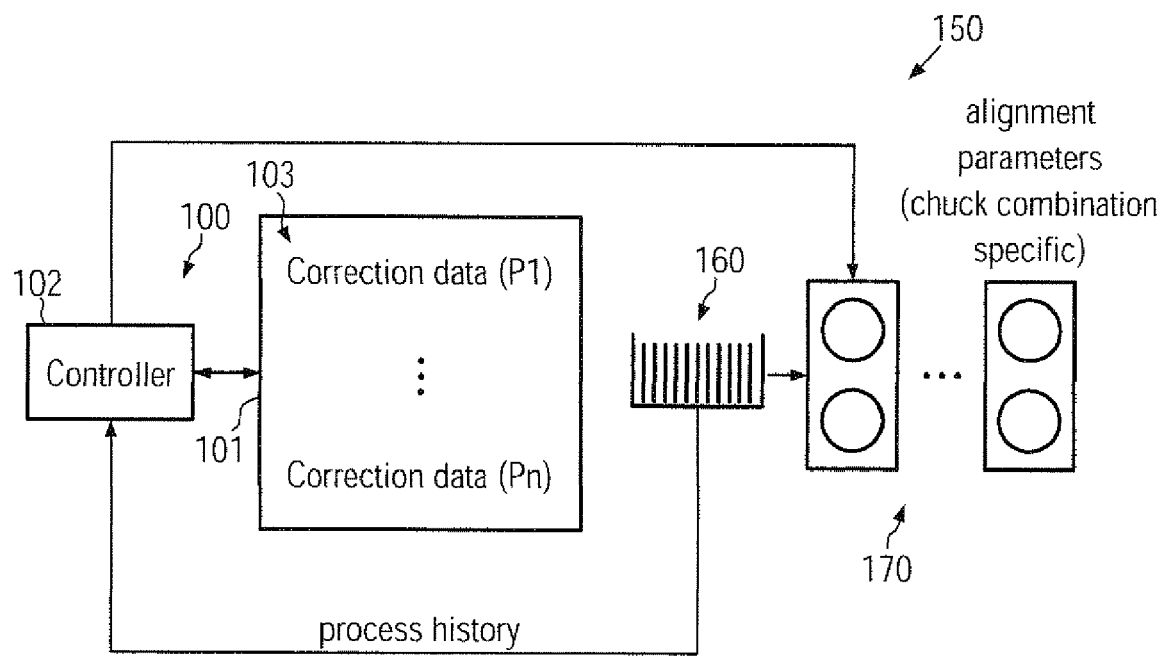
FIG. 1d schematically illustrates a control system for processing substrates so as to form a subsequent critical device layer on the basis of process history information and respective correction data sets associated with process flows, according to further illustrative embodiments.

FIG. 1d schematically illustrates the environment 150 in combination with a control system 100 having implemented therein the above-specified control mechanism on the basis of a plurality of process flows and associated overlay correction data sets. As illustrated, the system 100 may comprise a database 101 including a plurality of overlay correction data sets 103, wherein at least one correction data set is associated with each of the various process flows P1 . . . Pn. As previously explained, each of the overlay correction data sets 103 may comprise at least respective corrections for alignment parameters that are process flow specific in the sense that, in the corresponding correction data, the mutual influence of the substrate holders C1 and C2 of each of the lithography tools 170 may also be contained. Furthermore, the system 100 may comprise a controller 102, which may receive process information, for instance process history of the substrates 160 to be processed in one of the tools 170 so as to form the device layer 162 (FIG. 1a). For example, the process history may enable the extraction of information with respect to the present ordering of the substrates 160 prior to the supply of one of the lithography tools 170 so that the controller 102 may instruct a corresponding rearrangement, for instance during the sort step 175 (FIG. 1c), thereby ensuring that each of the substrates 160 may be processed in accordance with one of the process flows P1 . . . Pn. Furthermore, the process information may contain information with respect to the processing of the substrate 160 when forming the reference layer A, i.e., the layer 161 (FIG. 1a), thereby enabling the controller 102 to retrieve the appropriate correction data set from the database 101. Consequently, on the basis of the appropriately selected correction data set, the controller 102 may supply corrections with respect to alignment parameters to the lithography tool which is to process the substrates 160.

Figure 1E:
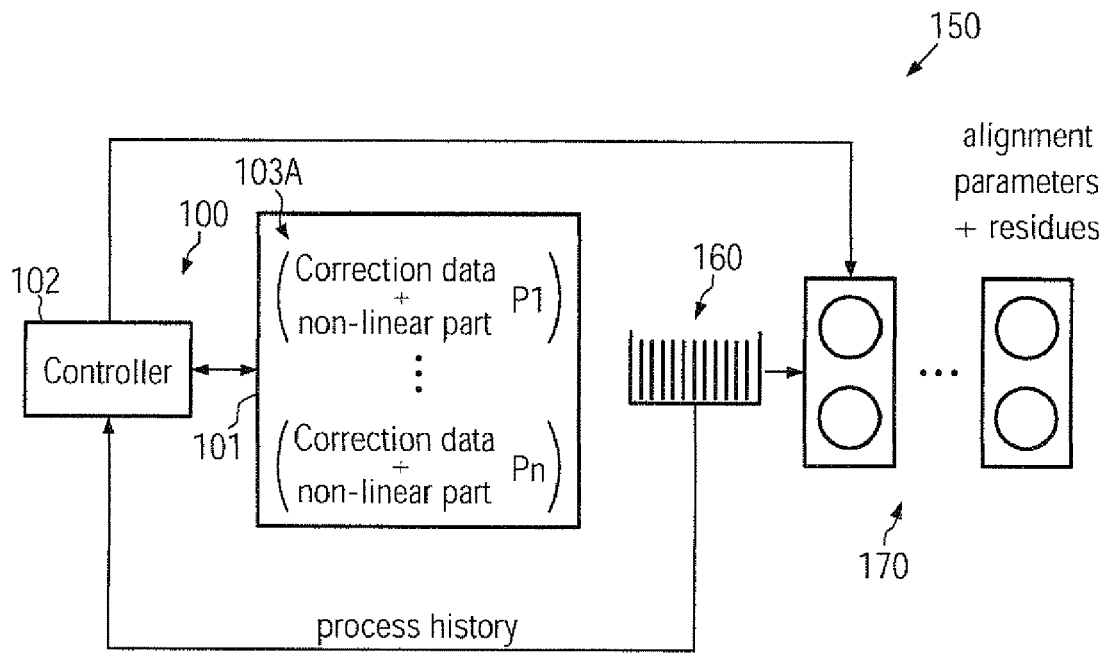
FIG. 1e schematically illustrates a control system based on correction data sets and process flows as specified above wherein, additionally, a non-linear part of correction data may be used, according to further illustrative embodiments.

FIG. 1*e* schematically illustrates the environment 150 comprising the system 100 according to still further illustrative embodiments. In these embodiments, additional correction data may be maintained in the database 101 in a process flow specific manner. In one illustrative embodiment, the non-linear part of the overlay error may be determined for each of the possible process flows so as to further enhance overall alignment accuracy. For this purpose, measurement data from processed substrates may be obtained, for instance from each of the corresponding exposure fields, and the corresponding measurement data may be used to calculate the residual part on the basis of the corresponding linear model used to determine the corresponding linear alignment parameters. The corresponding calculation may be performed for each process flow, thereby providing a map of non-linear residues for each of the possible process flows, which may thus represent corresponding influences of the various combinations of lithography tools and substrate holders, which may actually not be taken into consideration when merely applying the corrections for the linear alignment parameters. Thus, respective extended overlay correction data sets 103A may be retrieved upon the respective process information for the substrates 160, thereby even further enhancing overall alignment accuracy compared to conventional strategies in which non-linear differences between the corresponding substrate holders may not be taken into consideration.

Figure 1F:
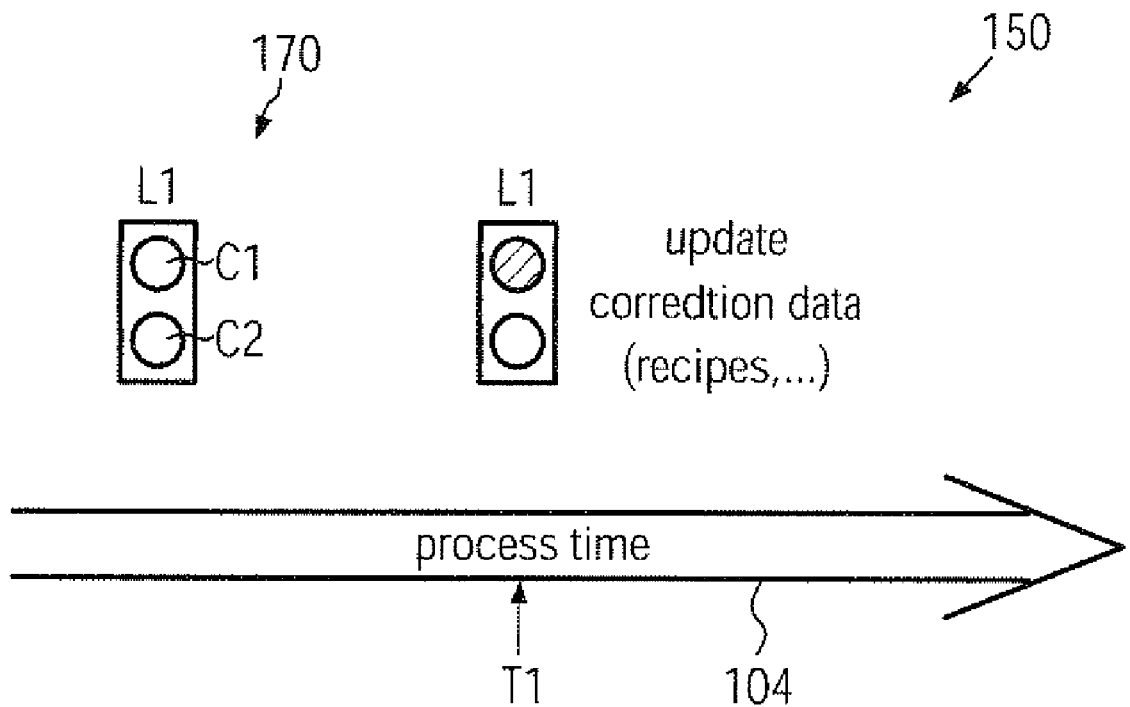
FIG. 1f schematically illustrates a process flow and corresponding lithography tools wherein process flow specific correction data sets may be updated upon detecting a drift or any other significant change in one of the process flows, according to illustrative embodiments.

FIG. 1*f* schematically illustrates the environment 150 according to further illustrative embodiments in which additionally a mechanism may be implemented into the control system 100 so as to track any significant changes in tool status and in particular in the status of substrate holders 171. As shown in FIG. 1*f*, during process time, as indicated by 104, the lithography tools 170 may change to a certain degree, for instance with respect to overall drift, change of hardware and the like. For convenience, in FIG. 1*f*, only the lithography tool L1 may be illustrated. Although minor drifts in the tool status and/or minor changes in the technology may be compensated for by the corresponding APC mechanism, nevertheless significant changes may occur which may no longer be compatible with the corresponding process windows of the APC control mechanisms. For example, it may be assumed that the lithography tool L1 may process substrates on the basis of a more or less stable configuration up to a point in time T1 in which a change of tool status may be detected. For instance, a corresponding detection may involve a change of the hardware, a significant tool drift and the like. For example, as indicated, a significant change in the configuration of the substrate holder C1 may have occurred at point T1. Consequently, a corresponding update of recipes may be required since the previously used recipes, i.e., alignment parameters and the like, may no longer be appropriated so as to comply with the new status of the tool L1. Thus, also the process flow specific overlay correction data sets 103 may be updated in order to reflect the new tool status. In the example shown and referring to the table of FIG. 1*b*, the process flows P1, P3, P5 and P6 may be concerned by the new status of the tool L1 due to a significant change of the substrate holder C1. Consequently, the associated overlay correction data sets 103 may also be updated, as indicated by 103*u*. The corresponding updated versions of the correction data sets 103*u* may be marked with a corresponding "version number" so that a historical development of the each of the correction data sets 103 may be accomplished.

For example, a respective version number may be increased each time a corresponding event may require a corresponding updating. On the other hand, the "historic" correction data may still be maintained, at least back to a specific time horizon, so that also these old correction data sets may be available for the processing of substrates having received a lithography process on the basis of a tool status which may correspond to the historical set of correction data. That is, any substrate processed in the lithography tool L1 prior to the time T1 for forming the reference layer A, i.e., the layer 161 (FIG. 1*a*), may be processed during the further lithography process for forming the layer 162 (FIG. 1*a*) on the basis of a process flow specific correction data set corresponding to this state of the tool and on the basis of the present state of the lithography tool to be used in the next lithography process. On the other hand, any group of substrates that is processed after time T1 may be processed on the basis of the updated version. In this manner, a correct assignment of tool status and substrates may be accomplished, even if the various groups of substrates may be mixed during a plurality of intermediate non-lithography processes.

Thus, in some illustrative embodiments, the process flow specific correction data sets may include process flow specific and thus chuck combination specific correction data for the linear alignment parameters and the non-linear part and may also reflect the progression of the tool status over process time. Consequently, a corresponding policy may also cover situations in which a tool dedication may be used, since in this case various versions of the process specific correction data sets may reflect a change in status of the substrate holders in the same lithography tool.

In further illustrative embodiments, the definition of the process flows 103, 103A, 103*u* may be refined with respect to non-lithography processes. For example, the process flows P1 . . . Pn (FIG. 1*b*) may be "divided" into additional branches with respect to one or more additional non-lithography tools, such as the tools 180 (FIG. 1*a*). As previously explained, typically, a plurality of additional process steps may have to be performed, such as etching, polishing, annealing and the like, which may also have a specific influence on the overall placement accuracy of the corresponding device features. Since typically many of these processes may also be performed by using a plurality of equivalent process tools or process chambers, the overall alignment accuracy may also depend on the specific path taken by a corresponding substrate. Consequently, additional process flows may be introduced by also referencing corresponding process tools for one or more additional process steps. For example, if a plurality of etch tools may be used, each of the process flows P1 . . . Pn may be divided into a corresponding number of process flows, each of which may now represent a specific lithography tool-substrate holder-etch tool combination. Thus, also in this case, the same strategies may be applied as described above, thereby providing an even further enhanced overall alignment accuracy. Since the corresponding process path may readily be determined on the basis of respective process information, which may be delivered by a supervising control system, as may typically be provided in complex semiconductor manufacturing environments, the updating and retrieving of the appropriate overlay correction data sets may efficiently be accomplished.

As a result, the present disclosure provides techniques and systems for enhancing overall alignment accuracy while at the same time increasing flexibility in product scheduling in complex manufacturing environments in which typically critical lithography steps may be performed by a plurality of lithography tools. For this purpose, overlay correction data sets may be provided in a process flow specific manner such that the tool status including the status of respective substrate holders at the time at which a substrate has received a reference layer may be taken into consideration together with the current tool state of the lithography tool to be used for forming the subsequent device layer. Furthermore, non-linear overlay errors may be taken into consideration for the various process flows, thereby even further enhancing overall process efficiency. In some illustrative embodiments, a reduction of the number of process flows may be accomplished by implementing appropriate rules for operating the lithography tools and introducing an additional sort step prior to processing the substrates.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    generating a plurality of sets of overlay correction data for a pair of a first lithography tool and a second lithography tool, said first lithography tool being used for imaging a first device layer on a substrate, said second lithography tool being used for imaging a second device layer on said substrate, said second device layer being spatially related to said first device layer, each of said plurality of sets of overlay correction data corresponding to a different status of at least one of the first and second lithography tools;
    obtaining process information associated with a product substrate to be processed in said second lithography tool, said product substrate having formed thereon said first device layer, said process information indicating a status of said first lithography tool when processing said product substrate;
    selecting one of said plurality of sets of overlay correction data that represents the status of said first lithography tool when processing said product substrate and a current status of said second lithography tool; and
    processing said product substrate in said second lithography tool on the basis of said selected one of the plurality of sets of overlay correction data.

2. The method of claim 1, wherein generating said plurality of sets of overlay correction data comprises, for each set, generating a first subset of overlay correction data for a first substrate holder and a second subset for a second substrate holder of each of said first and second lithography tools.

3. The method of claim 1, wherein generating said plurality of sets of overlay correction data comprises, for each set, generating a first subset of overlay correction data for a first predefined combination of a substrate holder of said first lithography tool and a substrate holder of said second lithography tool and generating a second subset for a second predefined combination of a substrate holder of said first lithography tool and a substrate holder of said second lithography tool.

4. The method of claim 3, further comprising operating said first and second lithography tools so as to avoid a combined process flow in said first and second lithography tools that is different to a process flow defined by said first and second predefined combinations.

5. The method of claim 4, wherein operating said first and second lithography tools comprises starting processing of an associated group of substrates in each of said first and second lithography tools with a predefined substrate holder.

6. The method of claim 5, further comprising sorting said substrates of said associated group prior to starting processing in said second lithography tool.

7. The method of claim 1, wherein generating said plurality of sets of overlay correction data comprises determining a non-linear part of said overlay correction data for each of said plurality of sets of overlay correction data.

8. The method of claim 7, further comprising determining said non-linear part of said overlay correction data for at least some process flows defined by said first and second lithography tools.

9. The method of claim 1, further comprising identifying at least one intermediate non-lithography process performed by two or more intermediate process tools and generating a respective plurality of sets of overlay correction data for each respective process flow defined by said first and second lithography tools and said two or more intermediate process tools.

10. The method of claim 9, wherein said intermediate non-lithography process comprises at least one of an etch process, a chemical mechanical planarization process and an anneal process.

11. A method, comprising:
    associating each of a plurality of process flows with at least one of a plurality of sets of overlay correction data, each process flow being defined by processing a substrate first in a first lithography tool and then in a second lithography tool, said process flows differing from each other at least in a combination of substrate holders used for processing said substrate in said first and second lithography tools; and
    processing at least one further substrate according to one of said plurality of process flows by using an associated one of said plurality of sets of overlay correction data when processing said at least one further substrate in said second lithography tool.

12. The method of claim 11, further comprising operating said first and second lithography tools so as to exclude additional process flows other than said plurality of process flows.

13. The method of claim 12, further comprising performing a sort process for an associated group of substrates including said at least one further substrate prior to processing said associated group of substrates.

14. The method of claim 11, further comprising determining said plurality of sets of overlay correction data so as to obtain process flow specific correction values for a plurality of alignment parameters.

15. The method of claim 14, wherein determining said plurality of sets of overlay correction data further comprises determining a process flow specific non-linear part of each of said plurality of alignment parameters for each of said process flows.

16. The method of claim 11, further comprising updating a respective one of said plurality of sets of overlay correction data when a change in an associated one of said plurality of process flows is detected while maintaining a previous version of said updated set of overlay correction data.

17. The method of claim 16, wherein processing said at least one further substrate comprises using said previous version when processing said at least one further substrate according to said respective process flow and said at least one further substrate has been processed in said first lithography tool prior to updating said respective one of said plurality of sets of overlay correction data.

18. The method of claim 11, wherein said plurality of process flows are differing from each other in at least one non-lithography process.

19. The method of claim 18, wherein said at least one non-lithography process is at least one of an etch process, an anneal process and a chemical mechanical planarization process.

* * * * *